(12) United States Patent
Parkes, Jr. et al.

(10) Patent No.: US 7,397,291 B1
(45) Date of Patent: Jul. 8, 2008

(54) CLOCK JITTER MINIMIZATION IN A CONTINUOUS TIME SIGMA DELTA ANALOG-TO-DIGITAL CONVERTER

(75) Inventors: John J. Parkes, Jr., Boynton Beach, FL (US); James G. Mittel, Boynton Beach, FL (US); James J. Riches, Lake Worth, FL (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/621,844

(22) Filed: Jan. 10, 2007

(51) Int. Cl.
*H03K 3/70* (2006.01)
*H03K 3/023* (2006.01)
*H03M 1/66* (2006.01)

(52) U.S. Cl. ............... 327/176; 327/291; 327/172; 327/165; 341/144; 341/143

(58) Field of Classification Search ............. 327/165, 327/172, 176, 291, 299; 341/143, 144
See application file for complete search history.

(56) References Cited

U.S. PATENT DOCUMENTS

| | | | |
|---|---|---|---|
| 4,245,167 A * | 1/1981 | Stein | 327/176 |
| 4,687,998 A * | 8/1987 | Takatori et al. | 327/126 |
| 5,578,952 A * | 11/1996 | Shoji | 327/172 |
| 5,583,461 A * | 12/1996 | Lowe | 327/172 |
| 5,982,315 A | 11/1999 | Bazarjani et al. | |
| 6,111,532 A | 8/2000 | Hirano et al. | |
| 6,538,588 B1 | 3/2003 | Bazarjani | |
| 6,853,227 B2 * | 2/2005 | Laletin | 327/175 |

FOREIGN PATENT DOCUMENTS

JP 01093206 A * 4/1989

* cited by examiner

*Primary Examiner*—Howard Williams (57) ABSTRACT

A digital-to-analog converter adapted for use as a feedback converter in a continuous time sigma delta analog-to-digital converter. The digital-to-analog converter has a discrete time digital signal input accepting digital signal samples that are synchronized with an assertion of a first data clock signal and a discrete time clock generator that generates an output pulse in response to receiving an assertion of the first data clock. The output pulse is asserted for a fixed duration that is independent of a jitter of the first data clock. The digital-to-analog converter also includes a continuous time analog output that produces, during assertion of the output pulse, a continuous time analog output signal having a magnitude corresponding to the digital signal samples.

20 Claims, 4 Drawing Sheets

CLOCK JITTER MINIMIZATION IN A CONTINUOUS TIME SIGMA DELTA ANALOG-TO-DIGITAL CONVERTER

BACKGROUND

1. Field

This disclosure relates generally to analog-to-digital conversion circuits, and more specifically, to continuous time sigma/delta analog-to-digital conversion circuits.

2. Related Art

Sigma/delta analog-to-digital converters (ADCs) are incorporated in various signal conversion applications. Some sigma/delta analog-to-digital converters use discrete time techniques to inject a feedback analog signal into the feedback loop filter and others use a continuous time technique. Discrete feedback in a sigma/delta analog-to-digital converter is typically implemented by using switch capacitor techniques for the integrators and a feedback digital-to-analog converter. During portions of the sample clock, charge transfer is taking place on and off the capacitors inside the integrator and inside the feedback digital-to-analog converter sub-blocks. Clock jitter on the pulse width of the sample clock has the effect of modulating the pulse width of the sample clock in a random manner. Discrete time feedback techniques only require that the charge be transferred on or off the capacitor during that portion of the clock, thus eliminating the effect of jitter on the sample clock pulse width. Continuous time feedback techniques generally use current or voltage sources which are gated on or off directly by the sample clock. As sample clock pulse width jitter randomly modulates the pulse width of the sample clock, the feedback coefficients are also being effectively randomly modulated as well because the time during which current or voltage is provided to the feedback filter (and thus integrated) varies from sample to sample. Sample clock pulse width jitter therefore has a major effect on the signal-to-noise ratio of the sampled signal.

Using discrete time feedback techniques generally requires higher current drain in a sigma/delta analog-to-digital converter than using continuous time feedback techniques. The additional current drain for discrete feedback techniques is due, for example, to the fact that such circuits perform at the sampling clock rate and must support large instantaneous currents as the capacitor charge transfer takes place, without slew-rate limiting the integrator output signal. In contrast, continuous time feedback techniques are only required to respond across the band of interest. Overcoming problems associated with sample clock pulse width jitter is a challenge in realizing continuous time feedback techniques in a sigma/delta analog-to-digital converter. Sample clock pulse width jitter randomly varies the timing of the clock edges and is usually specified in pico-seconds (ps). Clock pulse width jitter affects all analog-to-digital converters by degrading the signal-to-noise ratio (SNR) of the sampled signal and thereby effectively reducing a converter's dynamic range and increasing the noise level.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
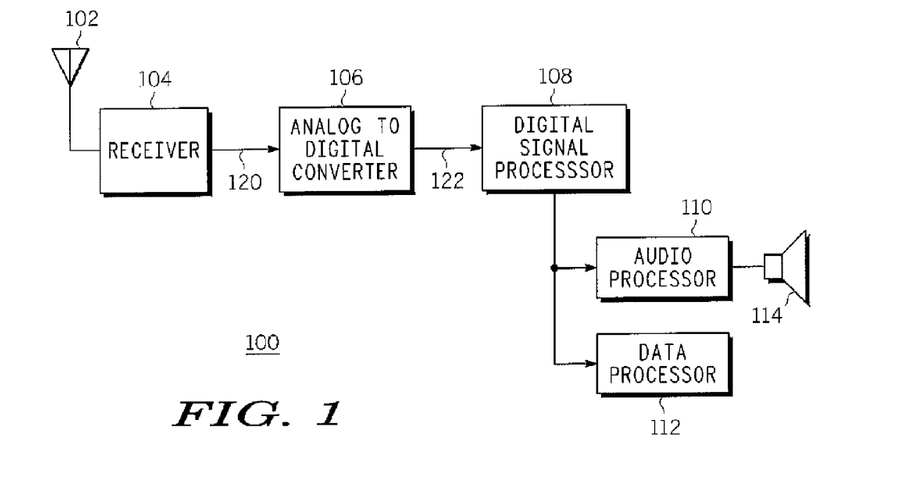
FIG. 1 illustrates a wireless receiver circuit incorporating a continuous time sigma/delta analog-to-digital converter, in accordance with one embodiment of the present invention.

FIG. 1 illustrates a wireless receiver circuit 100 incorporating a continuous time sigma/delta analog-to-digital converter, in accordance with one embodiment of the present invention. The wireless receiver circuit 100 is a wireless processing circuit that includes an antenna 102 that provides received RF signals to a receiver 104. The receiver 104 of one embodiment is a wireless signal processor that processes a wireless signal by downconverting and conditioning selected received signals in preparation for analog to digital conversion. The receiver 104 provides a downconverted signal 120 to an analog-to-digital (A/D) converter 106. The analog-to-digital converter 106 of one embodiment of the present invention is a continuous time sigma/delta analog-to-digital converter, as is described in detail below. The analog-to-digital converter 106 provides a digitized output signal 122, which represents the selected received signals, to a digital signal processor 108.

The digital signal processor 108 of one embodiment performs processing to, for example, properly receive and track one or more types of received signals. The digital signal processor 108 of one embodiment provides digital signals to an audio processor 110 and a data processor 112. The audio processor 110 of one embodiment is able to accept digital data representing audio signals and provide conditioned analog audio signals to a speaker 114 to allow reproduction of that audio signal. Data processor 112 includes processing to extract and produce user data conveyed through the received wireless signals, such as data carrying e-mail, internet traffic, or any other type of user data. Other embodiments may include other types of wireless receiver circuits and/or other configurations.

Figure 2:
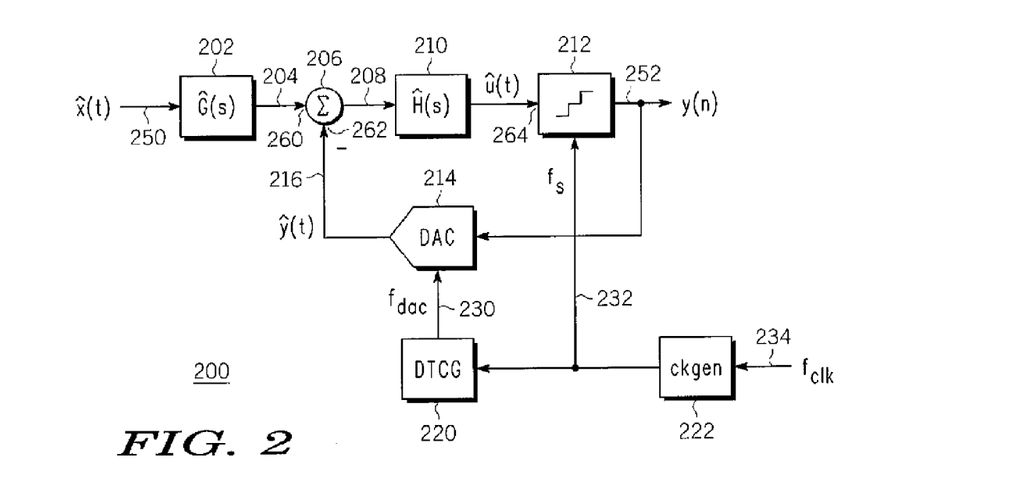
FIG. 2 illustrates a continuous time sigma/delta analog-to-digital converter as is incorporated into the wireless receiver of FIG. 1, in accordance with one embodiment of the present invention.

FIG. 2 illustrates a continuous time sigma/delta analog-to-digital converter 200 as is incorporated into the wireless receiver of FIG. 1, in accordance with one embodiment of the present invention. The continuous time sigma/delta analog-to-digital converter 200 accepts a continuous time input analog signal 250 that is filtered and conditioned as required for proper operation of the continuous time sigma/delta analog-to-digital converter 200 and produces a quantized, discrete time output 252. The generation of the discrete time and quantized output signal is controlled by a clock reference signal 234. Clock reference signal 234 of one embodiment is produced by other circuits (not shown) that control the discrete time processing of the quantized, discrete time output 252. For example, digital signal processor 108 operates based upon clocking signals related to the clock reference signal 234. The clock reference signal 234 of some embodiments exhibits pulse width jitter in excess of a pulse width jitter magnitude that is not acceptable for proper operation of the continuous time sigma/delta analog-to-digital converter 200, as is discussed in detail below. The clock reference signal 234 is provided to a clock generator 222 that provides the proper clocking signals to support proper signal sampling by the quantization stage 212 and also to drive the discrete time clock generator (DTCG) 220, as is also described below.

The continuous time sigma/delta analog-to-digital converter 200 accepts a continuous time input analog signal 250 that is filtered and conditioned as required for proper operation of the continuous time sigma/delta analog-to-digital converter 200. The continuous time sigma/delta analog-to-digital converter 200 includes a pre-filtering block 202 that further conditions and filters the continuous time input analog signal 250 to produce a conditioned analog input signal 204. The conditioned analog input signal 204 is provided to a sigma delta modulator 206. The sigma/delta modulator 206 of one embodiment has two continuous time analog inputs, a sigma, or summing, input 260 and a delta, or difference, input 262. The sigma/delta modulator 206 operates to subtract the continuous time signal at the delta input 262 from the continuous time signals at the sigma input 260 to produce a continuous time error signal 208 that is applied to a loop filter 210. Loop filter 210 of one embodiment implements a low pass filter to integrate the error signal 208 and produce a conditioned output consisting of a filtered continuous time signal that is provided to a quantization input 264 of the quantization stage 212.

The quantization stage 212 is an analog-to-digital converter that produces a quantized, discrete time output 252 based on its input. The quantization stage 212 of one embodiment is a multiple bit analog-to-digital quantizer. Further embodiments are able to incorporate single bit quantization stages. Timing for the quantization stage 212 of one embodiment of the present invention is driven by clock generator timing signals 232 that are generated by the clock generator 222. The clock generator timing signals 232 are derived from the clock reference signal 234 and have a phase accuracy required for the digital signal processing circuits that receive the quantized, discrete time output 252.

The quantized, discrete time output 252 is also provided to a digital-to-analog feedback converter 214. The digital-to-analog feedback converter 214 of one embodiment operates to accept the quantized, discrete time output 252 and produces a continuous time analog feedback signal 216 that has a magnitude corresponding to the quantized, discrete time output 252. The continuous time analog feedback signal 216 is provided to the sigma/delta modulator 206. The continuous time analog feedback signal 216 is subtracted from the continuous time input analog signal 204 by the sigma/delta modulator 206 and that difference signal is provided to the loop filter 210 to provide a filtered signal input to the quantization stage 212. In further embodiments of the present invention, continuous time sigma/delta analog-to-digital converters are able to have other configurations of components.

As is appreciated by practitioners of ordinary skill in the relevant arts in light of the present discussion, the continuous time sigma/delta analog-to-digital converter 200, which incorporates a digital-to-analog feedback converter 214, requires an accurate time period over which the output of the digital-to-analog feedback converter 214 is to be activated. The output of the digital-to-analog feedback converter 214 of one embodiment is activated by a discrete time clock generator 220, as is discussed below.

The discrete time clock generator 220 of one embodiment of the present invention is a very high quality, low noise mono stable multivibrator, or one-shot, that is used to gate the continuous time output of the digital-to-analog feedback converter 214. The discrete time clock generator 220 generates, in response to receiving an assertion of the clock generator timing signals 232, a digital-to-analog converter enable output pulse 230 that is asserted for a fixed duration. The fixed duration of the digital-to-analog converter enable output pulse 230 of one embodiment is independent of the pulse width jitter of the clock generator timing signals 232, which is based upon the clock reference signal 234. The use of a monostable multivibrator in the discrete time clock generator 220 allows the generation of a digital-to-analog converter enable output pulse 230 that is independent of the pulse width, and therefore the pulse width jitter of a corresponding pulse width duration of the clock generator timing signals 232 or clock reference signal 234. One embodiment of the present invention uses a clock reference signal 234 that is generated by timing circuitry used by other circuits to save power and reducing circuit component counts.

The discrete time clock generator 220 pulse width of one embodiment is set by a pair of resistor and capacitor (RC) time constants, a comparator, and a flip flop as is described in detail below. The RC values and the active devices of the discrete time clock generator 220 are designed for extremely low noise so as to minimize the pulse width jitter exhibited by the enable output pulse 230 generated by the discrete time clock generator 220. Because the enable output pulse 230 has a highly stable duration, the digital-to-analog feedback converter 214 generates the continuous time analog feedback signal 216 that is enabled for a precise period of time, thereby causing the feedback coefficients for the continuous time sigma/delta conversion operation to be unaffected by pulse width jitter or noise on the clock reference signal 234.

Figure 3:
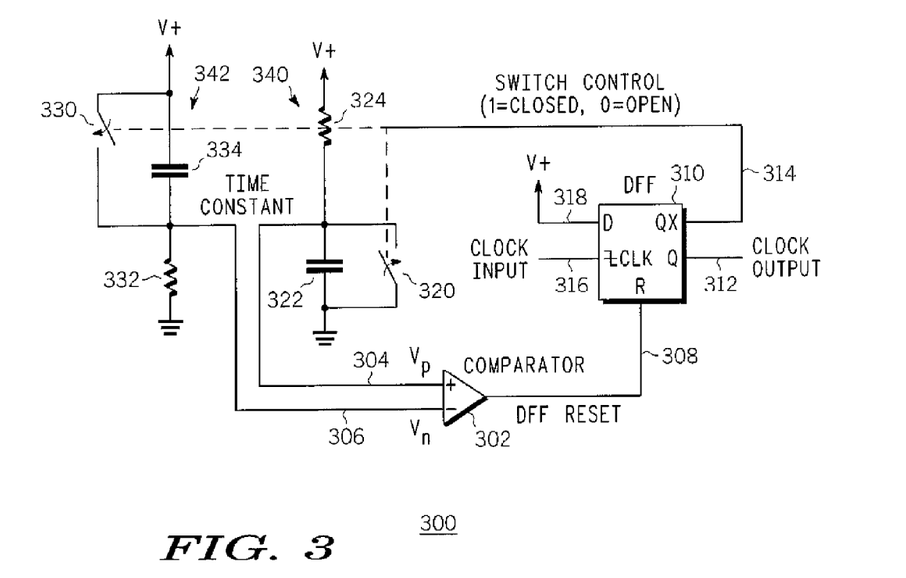
FIG. 3 illustrates a discrete time clock generator block diagram of a discrete time clock generator (DTCG) incorporated into the continuous time sigma/delta analog-to-digital converter illustrated in FIG. 2, in accordance with one embodiment of the present invention.

FIG. 3 illustrates a discrete time clock generator block diagram 300 of a discrete time clock generator (DTCG) 220 incorporated into the continuous time sigma/delta analog-to-digital converter 200 illustrated in FIG. 2, in accordance with one embodiment of the present invention. The discrete time clock generator 300 of one embodiment includes a D-type flip flop 310 with its D-input 318 held high and that triggers on the negative going edge of it's clock input 316, which corresponds to the clock generator timing signals 232. The reset line 308 of the D-type flip flop 310 is connected to an output of a differential comparator 302.

The differential comparator has a positive input 304 and a negative input 306. The positive input 304 is connected to a time constant circuit 340 and the negative input 306 is connected to a time constant circuit 342. The differential comparator 302 is configured to assert its output 308 while an output voltage of the time constant circuit 340 is higher than an output voltage of the time constant circuit 342. The time constant circuit 340 and the time constant circuit 342 of one embodiment have fixed time constants. One embodiment uses the described RC time constant circuit pair and a differential comparator to reduce timing variations caused by power supply voltage variations.

The time constant circuit 340 has a resistor 324 connected at a first connector to a high voltage level and a capacitor 322 connecting a second connector of the resistor 324 to a low voltage level. A first switch 320 is operated by the QX output, or switch control output, 314 to selectively short across the capacitor 322 and thereby connect the second connector of the resistor 324 to ground. The QX output 314 has an opposite polarity as the Q output, or clock output, 312, which corresponds to $f_{dac}$ 230. In this manner, the time constant circuit 340 is configured to maintain a low signal output prior to assertion of the output pulse of the clock output 312 and to increase output voltage to the positive input 304 of the differential comparator 302 during the output pulse of the clock output 312.

The time constant circuit 342 has a resistor 332 connected at a first connector to a low voltage level and a capacitor 334 connecting a second connector of the resistor 332 to a high voltage level. A second switch 330 is also operated by the QX output, or switch control output, 314 to selectively short across the capacitor 334 and thereby connect the second connector of the resistor 332 to a high voltage level. In this manner, the time constant circuit 342 is configured to maintain a high signal output prior to assertion of the output pulse of the clock output 312 and to decrease its output voltage to the negative input 306 of the differential comparator 302 during the output pulse of the clock output 312.

The operation of the discrete time clock generator 300 starts with the D-type flip flop 310 in its reset mode, resulting in the Q output, i.e., the clock output 312 that corresponds to $f_{dac}$ 230 being in its low state and the QX output, i.e., the switch control line, being in its high state. In this initial state, the RC time constant networks that include the time constant circuit 340 and the time constant circuit 342 are reset as well with the first switch 320 and the second switch 330 closed. The discrete time clock generator 300 accepts a clock input 316 from, for example, a clock generator 222. When the clock input 316 goes low, the D-type flip flop 310 toggles and the state of the Q output 312 and the QX output 314 change, thereby opening the first switch 320 and the second switch 330 and releasing the RC networks to charge. Once the voltage on the positive input $V_p$ 304 is greater than the voltage on the negative input $V_n$ 306, the differential comparator 302 asserts the reset line 308, and the D-type flip flop 310 is reset, causing the first switch 320 and the second switch 330 to be closed. The discrete time clock generator 300 is then reset and waits for the next pulse of the clock input 316.

The operation of discrete time clock generator 300 produces an output pulse at the Q output 312 of the D-type Flip Flop 310. The output pulse width duration of one embodiment is set by the RC time constants of the time constant circuit 340 and the time constant circuit 342 and not by the pulse duration of the clock input 316. In one embodiment, selection of devices to incorporate into the time constant circuit 340 and the time constant circuit 342 take into account the timing accuracy requirements for the proper operation of the continuous time sigma/delta analog-to-digital converter 200, particularly with respect to its tolerance for pulse width jitter for enabling the output of the continuous time analog feedback signal 216 and insertion into the loop filter 210.

In one embodiment of the present invention, components of either one or both of the time constant circuit 340 and the time constant circuit 342 are able to be trimmed during manufacturing or power-up circuit calibration in order to, for example, accommodate manufacturing tolerances of parts or other circuit components or to adjust the timing of the circuit. In one embodiment, at least one of the resistor 324, the resistor 332, the capacitor 322 and the capacitor 334 is able to be trimmed after construction of the circuit.

The resistors of one embodiment of the present invention are able to be trimmed using, for example, fuses that are trimmed by being blown open or diodes that are trimmed by being blown into a short. One embodiment of the present invention is able to directly measure values of the resistor 324 and the resistor 332 to implement proper trimming. Further embodiments are able to trim resistor values using a digital algorithm by comparing the resistance against an external precision resistor that is provided to the trim circuit. Such an external precision resistor is able to be connected through a pin on an integrated circuit that includes the discrete time clock generator 300.

The capacitor 322 and the capacitor 334 are able to be trimmed by measuring the time constant of the using a filter or oscillator response, depending on the design of the discrete time clock generator 300, the filter could be measured directly during capacitor trim or a separate oscillator (not shown) that is used for trimming purposes is able to be trimmed with the filter capacitors slaved to it so they track. Further embodiments are able to configure the oscillator in a phased locked loop with a clock reference with the capacitors of the time constant circuit can be slaved to the oscillator. Further embodiments are able to implement trimming of one or both of the resistors or capacitors of the time constant circuits through any suitable techniques.

Figure 4:
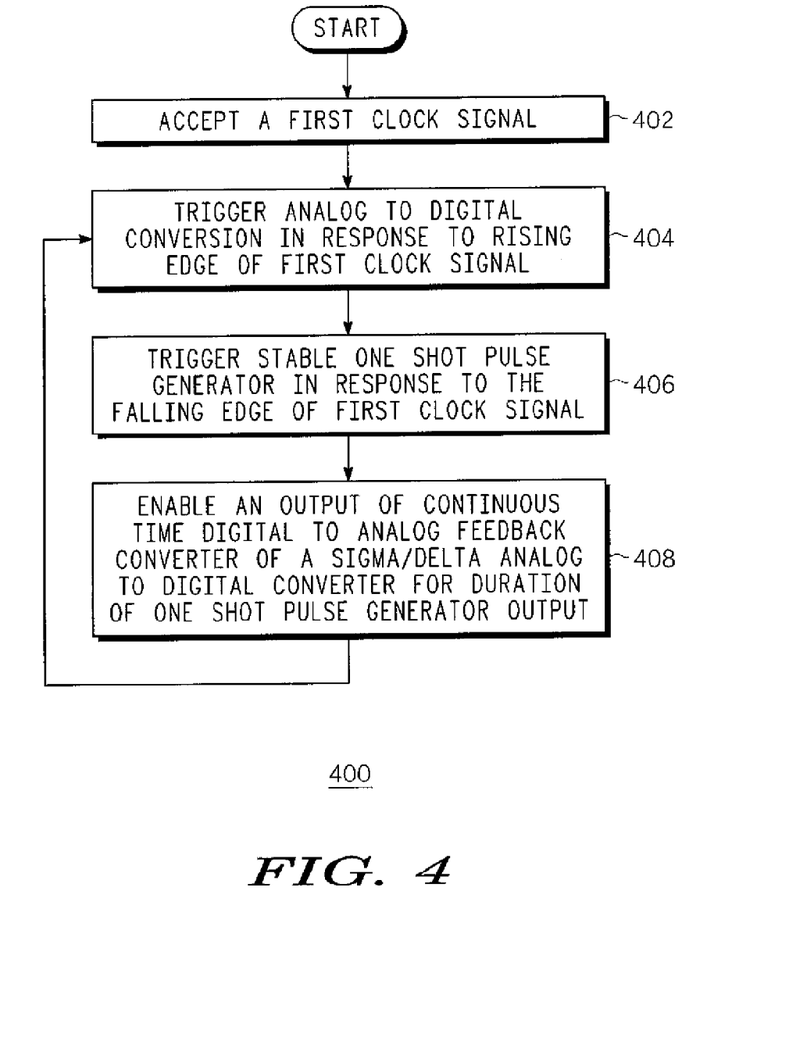
FIG. 4 illustrates a continuous time sigma/delta timing processing flow of the sigma/delta analog converter illustrated in FIG. 2, in accordance with one embodiment of the present invention.

FIG. 4 illustrates a continuous time sigma/delta timing processing flow 400 of the continuous time sigma/delta analog converter 200 illustrated in FIG. 2, in accordance with one embodiment of the present invention. The continuous time sigma/delta timing processing flow 400 begins by accepting, at step 402, a first clock signal, such as the clock reference signal 234.

The continuous time sigma/delta timing processing flow 400 continues by triggering, at step 402, an analog to digital conversion in response to a rising edge of the first clock signal. In one embodiment, this analog to digital conversion is triggered within the quantization stage 212.

The continuous time sigma/delta timing processing flow 400 of one embodiment proceeds by triggering, at step 406, a stable one shot pulse generator in response to the falling edge of the first clock signal 232. In one embodiment, the stable one shot pulse generator is contained within the discrete time clock generator 220.

The continuous time sigma/delta timing processing flow 400 then enables, at step 408, an output of a digital-to-analog feedback converter of a continuous time sigma/delta analog-to-digital converter for the duration of the one shot pulse generator output. The processing then continues by returning to triggering, at step 404, the analog to digital conversion in response to the next rising edge of the first clock signal.

Figure 5:
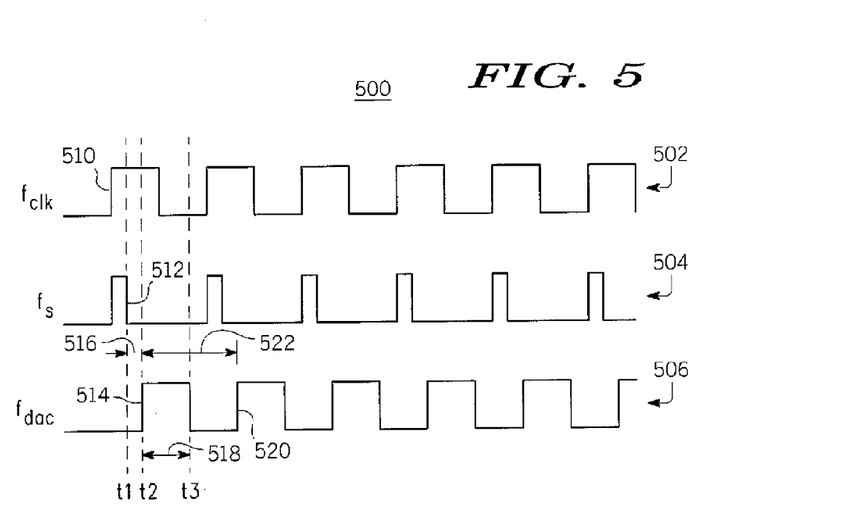
FIG. 5 illustrates a pulse timing relationship 500 for the timing signals represented for the continuous time sigma/delta analog-to-digital converter 200 illustrated in FIG. 2, in accordance with one embodiment of the present invention.

FIG. 5 illustrates a pulse timing relationship 500 for the timing signals represented for the continuous time sigma/delta analog-to-digital converter 200 illustrated in FIG. 2, in accordance with one embodiment of the present invention. The pulse timing relationship 500 illustrates timing pulse trains for the various timing signals illustrated for the continuous time sigma/delta analog-to-digital converter 200. An $f_{clk}$ pulse train 502 corresponds to the signal received on the clock reference signal 234 input. An $f_s$ pulse train 504 corresponds to the clock generator timing signals 232 generated by the clock generator 222 based upon, and in response to, the clock reference signal 234 input. An $f_{dac}$ pulse train 506, which corresponds to the clock output 312, corresponds to the continuous time analog feedback signal 216 as generated by the discrete time clock generator 222 in response to the $f_S$ pulse train 504 generated by the clock generator.

The $f_{clk}$ pulse train 502 shows a first clock input rising edge 510. The noise level and pulse width of pulses within the $f_{clk}$ pulse train 502 received from the clock generator timing signals 234 may generally be incompatible with the clocking requirements for the circuits of the continuous time sigma/ delta analog-to-digital converter 200, and therefore the clock generator 222 is included in one embodiment to create the $f_s$ pulse train 504. The $f_s$ pulse train 504 of one embodiment is shown to have a first clock pulse falling edge 512 that occurs in response to the first clock input rising edge 510. The pulse width of pulses within the $f_s$ pulse train 504 is adapted to properly drive the components of the continuous time sigma/delta analog-to-digital converter 200.

The $f_{dac}$ pulse train 506 is generated by the discrete time clock generator 220 and consists of pulses that have precise pulse durations. The $f_{dac}$ pulse train 506 has a first timer output pulse rising edge 514 that occurs in response to the first clock pulse falling edge 512. In one embodiment, the first timer output pulse rising edge 514 is triggered in response to the falling edge 512 of the $f_s$ pulse train 504 so that the analog to digital conversion performed by the quantization stage 212 is complete prior to enabling the output of the digital-to-analog feedback converter 214. The pulses of the $f_{dac}$ pulse train 506 have pulse widths 518 that exhibit low variation from pulse to pulse. In one embodiment, the time delay 516 from the first clock pulse falling edge 512 to the first timer output pulse rising edge 514 is not critical and is able to vary. Furthermore, the time duration between rising edges of subsequent pulses, such as a second time duration 522 between the first timer output pulse rising edge 514 and a second timer output pulse rising edge 520 is also able to exhibit some pulse-to-pulse jitter, i.e., in the period between pulse rise times. In one embodiment, the output pulse is asserted, during the pulse width 518, during the period between pulses of the $f_s$ pulse train 504.

Figure 6:
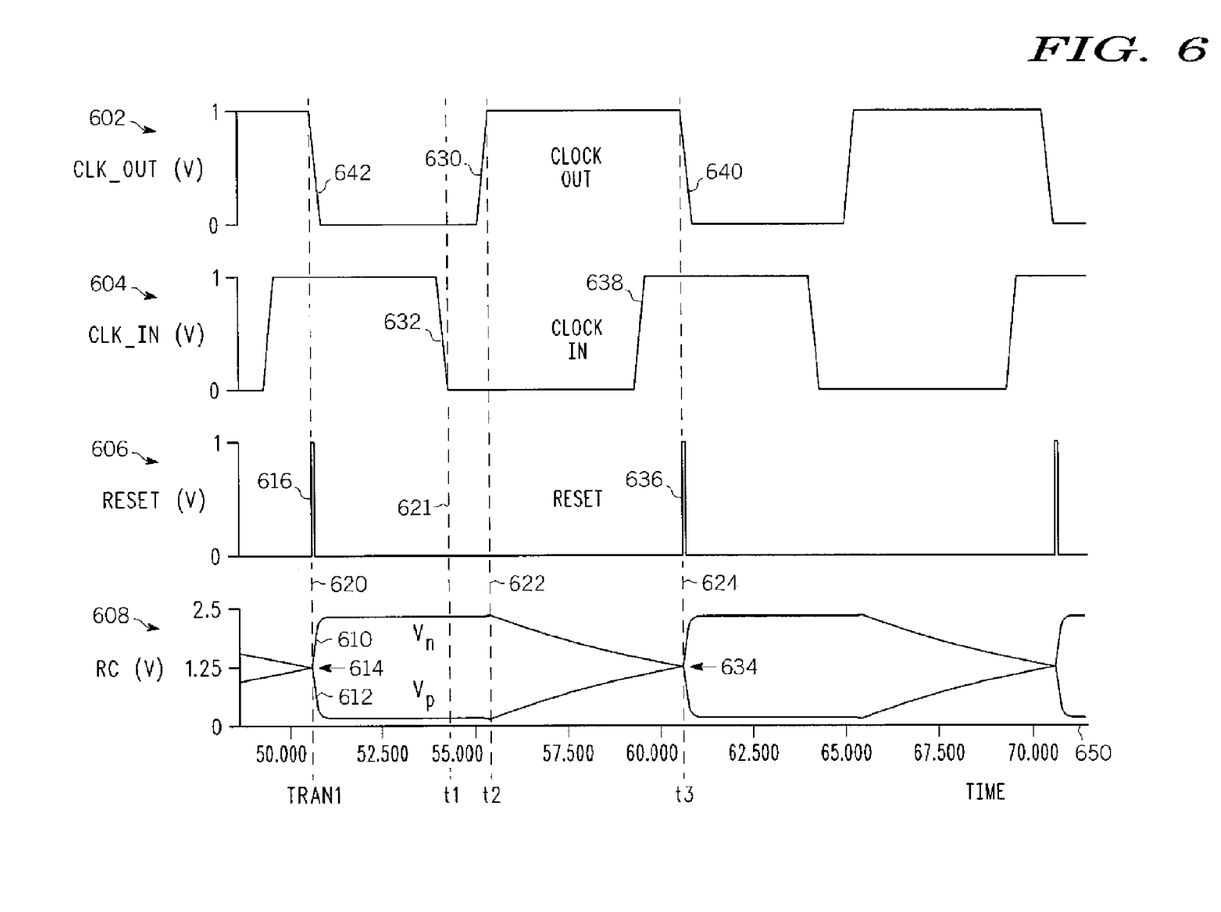
FIG. 6 illustrates timing waveforms the discrete time clock generator illustrated in FIG. 3, in accordance with one embodiment of the present invention.

FIG. 6 illustrates timing waveforms 600 of the discrete time clock generator 300 illustrated in FIG. 3, in accordance with one embodiment of the present invention. The timing waveforms 600 include four (4) time-versus-voltage waveforms for various points of the discrete time clock generator 300. The timing waveforms 600 share a common time scale 650.

A first waveform is a clock out waveform 602 that corresponds to the clock output 312 for the discrete time clock generator 300 of one embodiment. A second waveform is a clock in waveform 604 that corresponds to the clock input 316 of the discrete time clock generator 300 of one embodiment. As was discussed above, the discrete time clock generator 300 accepts a clock input 316 and produces a clock output 312 that has a pulse width that has low pulse width variations from pulse to pulse. The clock output 312 produced by the discrete time clock generator 300 is suitable for use in, for example, timing a continuous time feedback signal in a sigma delta analog-to-digital converter.

The clock in waveform 604 of one embodiment is received from a clock generator 222 in response to clock reference signal 234 that is received from other circuits that operate with the discrete time clock generator 300. The clock in waveform 604 can exhibit timing jitter between the rising and falling edges of the waveform such that the period of each pulse within the clock in waveform 604 is able to vary by a duration that impacts the effective operation of a continuous time sigma/delta analog-to-digital converter 200 if the clock in waveform 604 were to be used to gate the output of the digital-to-analog feedback converter (DAC) 214 for insertion into the loop filter 210.

A third waveform illustrated in the timing waveforms 600 is the reset waveform 606 that corresponds to the signal present at the D-type flip flop reset input 308, which is the signal produced by the output of the comparator 302 of the discrete time clock generator 300. As discussed above, the D-type flip flop reset input 308 is triggered by an output level shift of the comparator 302 after an expiration of a predetermined time period after a change in input voltage from a high level to a low level of the clock input 316. The timing waveforms 600 show the clock input high to low transition 632, which is indicated as $t_1$ 621 in this illustration, as part of the clock in waveform 604. The time period between the high to low transition 632 of the clock in waveform 604 to the first transition of the clock output 602, which is indicated as $t_2$ in this illustration, is a result of timing latencies of the various circuit components. As described above, the transition of the clock output 312 also results in transitioning of the QX line 314 and triggering of the time constant circuits.

A fourth waveform illustrated in the timing waveforms 600 are comparator inputs waveforms 608 that include the time versus voltage characteristics of both the $V_n$ 306 and the $V_p$ 304 as illustrated for the discrete time clock generator 300. As is described above, the $V_n$ 306 and the $V_p$ 304 signals is each an output of a respective timing circuit. The $V_p$ 304 output is the output of a first timing circuit 340 and the $V_n$ 306 output is the output of the second timing circuit 342.

The $V_n$ 306 signal is illustrated in the comparator input waveforms 608 as an upper trace 610 and the $V_p$ 304 signal is illustrated in the comparator input waveforms 608 as a lower trace 612. The illustrated comparator input waveforms 608 begin with $V_n$ 610 decreasing with time and $V_p$ 612 increasing with time. This change in voltage occurs through a first transition time 620, denoted as TRAN1 in this illustration, where the relative values of $V_n$ 610 and $V_p$ 612, which are the inverted input and non-inverted input of comparator 302, are such that the output of comparator 302 changes from low to high.

The output of comparator 302 is illustrated by the reset waveform 606 and is shown to have a first reset signal transition 616 that occurs at the first transition time 620. The first reset signal transition 616 of one embodiment occurs due to the relationship of the voltage levels of the $V_n$ 306 signal and the $V_p$ 304 signal that are present at the two inputs of comparator 302.

In response to the first reset signal transition 616 on the D-type flip flop reset signal 308, the D-type flip flop 310 resets and the state of the outputs of the D-type flip flop 310 change state. The Q output of the D-type flip flop 310, which drives the clock output 312 and has a level reflected in the clock out waveform 602, has a first clock out transition 642 and changes from a high level to a low level. The QX output of the D-type flip flop 310, which changes along with the Q output of the D-type flip flop 310 and has an inverse polarity, changes from a low level to a high level. The QX output's transition to a high level causes the first switch 320 and the second switch 330 to close and short across their respective capacitors. The closing of the first switch 320 causes the $V_p$ signal 304, and represented by lower trace 612, to transition to a low level at the first transition time 620. The closing of the second switch 330 causes the $V_n$ signal 306, and represented by upper trace 610, to transition to a high level at the first transition time 620.

The $V_p$ signal 304 retains a low level and the $V_n$ signal 306 retains a high level until a second transition time 622. The second transition time 622 occurs when the clock output line 312 transitions from a low state to a high state at a second clock output transition 630. The second clock output transition 630 is triggered in response to a first clock in transition 632, which is in response to a transition on the clock input 316 from a high to a low level at the first transition time 620. The operation of one embodiment accommodates a delay between the first transition time 620 and the assertion of the clock output 312 and the QX line 314 that controls the first switch 320 and the second switch 330.

Upon the transition of the clock input 316 and the resulting change in state of the QX line 314, the first switch 320 opens and allows the first capacitor 322 to charge through the first resistor 324. The second switch 330 also opens and allows the second capacitor 334 to charge through the second resistor 332. The charging of these two capacitors allows voltage of $V_n$ 306 to decrease and the voltage of $V_p$ 304 to increase until their relative voltage levels at the two inputs of comparator 302 causes the output of comparator 302 to change state.

When $V_n$ 306 and $V_p$ 304 reach relative voltage levels that cause the output of comparator 302 to change state, a third transition time 624 occurs. At the third transition time 624, the output of comparator 302 changes state from a low level to a high level at a second reset line transition 636. The second reset line transition 636 triggers the reset input of the D-type flip flop 310 and causes the clock output line to change state at a third clock out transition 640. It is to be noted that the third clock out transition 640 is not related to the second clock in transition 638, which happens independently of the third clock out transition 640. The independence of these two clock transitions causes the pulse duration of the clock output signal 312, which corresponds to the time between the second clock out transition 630 and the third clock out transition 640, to be set only by the time constants determined by the first time constant circuit 340 and the second time constant circuit 342.

Although the invention is described herein with reference to specific embodiments, various modifications and changes can be made without departing from the scope of the present invention as set forth in the claims below. For example, various analog to digital conversion circuits are able to incorporate the feedback timing described herein. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A digital-to-analog converter, the digital-to-analog converter comprising:
   a discrete time digital signal input accepting digital signal samples that are synchronized with an assertion of a first data clock signal;
   a discrete time clock generator that generates, in response to receiving an assertion of the first data clock, an output pulse that is asserted for a fixed duration, the fixed duration being independent of a corresponding pulse duration of the first data clock, and
   a continuous time analog output, communicatively coupled to the discrete time digital signal input, producing a continuous time analog output signal during assertion of the output pulse, the continuous time analog output signal having a magnitude corresponding to the digital signal samples.

2. The digital-to-analog converter of claim 1, wherein the discrete time clock generator comprises a one shot monostable multivibrator.

3. The digital-to-analog converter of claim 1, wherein the continuous time analog output produces a constant output during the assertion of the output pulse and produces no output at other times.

4. The digital-to-analog converter of claim 1, wherein the discrete time clock generator comprises:
   a first time constant circuit having a first time constant and configured to maintain a low signal output prior to assertion of the output pulse and to increase output voltage during the output pulse;
   a second time constant circuit having a second time constant and configured to maintain a high signal output prior to assertion of the output pulse and to decrease output voltage during the output pulse; and
   a differential comparator comprising a positive input and a negative input, the positive input being communicatively coupled to the first time constant circuit and the negative input being communicatively coupled to the second time constant circuit, the differential comparator configured to assert the output pulse while an output of the first time constant circuit is higher than an output of the second time constant circuit and does not assert the output pulse while the output of the second time constant circuit is higher than the output of the first time constant circuit.

5. The digital-to-analog converter of claim 4, further comprising:
   a logic circuit communicatively coupled to the output of the differential comparator, the logic circuit accepting the first data clock and configured to assert, in response to the assertion of the first data clock, the output pulse for the duration of an assertion of the output pulse.

6. The digital-to-analog converter of claim 4, wherein the first time constant circuit comprises a first resistor and a first capacitor, the second time constant circuit comprises a second resistor and a second capacitor, wherein at least one of the first resistor, the second resistor, the first capacitor and the second capacitor is able to be trimmed to adjust timing.

7. A method for providing a continuous time analog feedback signal in a continuous time sigma delta analog-to-digital converter, the method comprising:
   accepting digital signal samples that are synchronized with an assertion of a first data clock signal;
   generating, in response to receiving an assertion of the first data clock, an output pulse that is asserted for a fixed duration, the fixed duration being independent of a corresponding pulse duration of the first data clock, and
   producing a continuous time analog output signal during assertion of the output pulse, the continuous time analog output signal having a magnitude corresponding to the digital signal samples.

8. The method of claim 7, wherein the step of generating comprises generating the output pulse with a one shot monostable multivibrator.

9. The method of claim 7, wherein the step of producing produces a constant output during the assertion of the output pulse and produces no output at other times.

10. The method of claim 7, wherein the generating the output pulse comprises:
   providing a first time constant circuit having a first time constant and configured to maintain a low signal output prior to assertion of the output pulse and to increase output voltage during the output pulse;
   providing a second time constant circuit having a second time constant and configured to maintain a high signal output prior to assertion of the output pulse and to decrease output voltage during the output pulse; and asserting the output pulse while an output of the first time constant circuit is higher than an output of the second time constant circuit.

11. The method of claim 9, further comprising:
asserting in response to the assertion of the first data clock, the output pulse for the duration of an assertion of the differential comparator.

12. The method of claim 9, wherein the first time constant circuit comprises a first resistor and a first capacitor, the second time constant circuit comprises a second resistor and a second capacitor, wherein at least one of the first resistor, the second resistor, the first capacitor and the second capacitor is able to be trimmed to adjust at least one of the first constant of the first time constant circuit and the second time constant of the second time constant circuit.

13. A wireless processing circuit, comprising:
a wireless signal processor that processes a received wireless signal in preparation for analog to digital conversion; and
an analog-to-digital converter communicatively connected to the wireless signal processor, the analog-to-digital converter comprising:
a sigma delta modulator that produces a continuous time error signal based upon a conditioned analog signal produced by the wireless signal processor and a continuous time feedback signal;
a loop filter that produces a conditioned output based upon the continuous time error signal;
a analog-to-digital converter that produces a discrete time and quantized output based upon the conditioned output; and
a digital-to-analog converter adapted for use as a feedback converter in a continuous time sigma delta analog-to-digital converter, the digital-to-analog converter comprising:
a discrete time digital signal input accepting digital signal samples that are synchronized with an assertion of a first data clock signal;
a discrete time clock generator that generates, in response to receiving an assertion of the first data clock, an output pulse that is asserted for a fixed duration, the fixed duration being independent of a jitter of the first data clock, and
a continuous time analog output, communicatively coupled to the discrete time digital signal input and the discrete time clock generator, producing the continuous time feedback signal during assertion of the output pulse, the continuous time feedback signal having a magnitude corresponding to the digital signal samples.

14. The wireless processing circuit of claim 13, wherein the continuous time analog output produces a constant output during the assertion of the output pulse and produces no output at other times.

15. The wireless processing circuit of claim 13, further comprising a wireless receiving antenna, communicatively coupled to the wireless signal processor, adapted to deliver received wireless signals to the wireless signal processor.

16. The wireless processing circuit of claim 13, further comprising a digital signal processor, communicatively coupled to the analog-to-digital converter, the digital signal processor adapted to processing the discrete time and quantized output.

17. The wireless processing circuit of claim 16, wherein the digital signal processor produces audio signals based upon the discrete and quantized output.

18. The wireless processing circuit of claim 13, wherein the discrete time clock generator comprises:
a first time constant circuit having a first time constant and configured to maintain a low signal output prior to assertion of the output pulse and to increase output voltage during the output pulse;
a second time constant circuit the second time constant circuit having a second time constant and configured to maintain a high signal output prior to assertion of the output pulse and to decrease output voltage during the output pulse; and
a differential comparator comprising a positive input and a negative input, the positive input being communicatively coupled to the first time constant circuit and the negative input being communicatively coupled to the second time constant circuit, the differential comparator configured to assert an output while an output of the first time constant circuit is higher than an output of the second time constant circuit.

19. The wireless processing circuit of claim 18, further comprising:
a logic circuit communicatively coupled to the output of the differential comparator, the logic circuit accepting the first data clock and configured to assert, in response to the assertion of the first data clock, the output pulse for the duration of an assertion of the differential comparator.

20. The wireless processing circuit of claim 18, wherein the first time constant circuit comprises a first resistor and a first capacitor, the second time constant circuit comprises a second resistor and a second capacitor, wherein at least one of the first resistor, the second resistor, the first capacitor and the second capacitor is able to be trimmed to adjust timing.

* * * * *